(12) United States Patent
Kabouzi et al.

(10) Patent No.: US 9,735,069 B2
(45) Date of Patent: Aug. 15, 2017

(54) METHOD AND APPARATUS FOR DETERMINING PROCESS RATE

(71) Applicant: Lam Research Corporation, Fremont, CA (US)

(72) Inventors: Yassine Kabouzi, Fremont, CA (US); Luc Albarede, Fremont, CA (US); Andrew D. Bailey, III, Pleasanton, CA (US); Jorge Luque, Redwood City, CA (US); Seonkyung Lee, Mountain View, CA (US); Thorsten Lill, Santa Clara, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 14/862,983

(22) Filed: Sep. 23, 2015

(65) Prior Publication Data

US 2017/0084503 A1 Mar. 23, 2017

(51) Int. Cl.

| | |
|---|---|
| *H01L 21/302* | (2006.01) |
| *H01L 21/461* | (2006.01) |
| *B44C 1/22* | (2006.01) |
| *C03C 15/00* | (2006.01) |
| *C03C 25/68* | (2006.01) |
| *C23F 1/00* | (2006.01) |
| *H01L 21/66* | (2006.01) |
| *H01L 21/3065* | (2006.01) |
| *H01L 21/311* | (2006.01) |
| *H01L 21/308* | (2006.01) |
| *H01L 21/3105* | (2006.01) |

(52) U.S. Cl.
CPC .......... *H01L 22/26* (2013.01); *H01L 21/3065* (2013.01); *H01L 21/3081* (2013.01); *H01L 21/3083* (2013.01); *H01L 21/31056* (2013.01); *H01L 21/31116* (2013.01)

(58) Field of Classification Search
None
See application file for complete search history.

(56) References Cited

U.S. PATENT DOCUMENTS

| | | | | |
|---|---|---|---|---|
| 5,830,807 A | * | 11/1998 | Matsunaga | ......... H01L 21/3065 216/68 |
| 5,966,586 A | * | 10/1999 | Hao | .................. H01J 37/32963 438/14 |
| 6,336,841 B1 | | 1/2002 | Chang et al. | |
| 2009/0014409 A1 | | 1/2009 | Grimbergen | |
| 2009/0045167 A1 | | 2/2009 | Maruyama | |
| 2010/0190098 A1 | | 7/2010 | Walker et al. | |
| 2012/0114836 A1 | | 5/2012 | Arno et al. | |
| 2012/0242989 A1 | | 9/2012 | So et al. | |
| 2013/0193108 A1 | * | 8/2013 | Zheng | .................... C23C 14/54 216/59 |

OTHER PUBLICATIONS

U.S. Appl. No. 14/863,211, filed Sep. 23, 2015.

* cited by examiner

*Primary Examiner* — Stephanie Duclair
(74) *Attorney, Agent, or Firm* — Beyer Law Group LLP

(57) ABSTRACT

A method for dry processing a substrate in a processing chamber is provided. The substrate is placed in the processing chamber. The substrate is dry processed, wherein the dry processing creates at least one gas byproduct. A concentration of the at least one gas byproduct is measured. The concentration of the at least one gas byproduct is used to determine processing rate of the substrate.

13 Claims, 8 Drawing Sheets

METHOD AND APPARATUS FOR DETERMINING PROCESS RATE

INCORPORATION BY REFERENCE

The present disclosure incorporates by reference the patent entitled, "APPARATUS FOR DETERMINING PROCESS RATE" by Albarede et al. filed on the same date, U.S. patent Ser. No. 14/863,211, which is incorporated by reference for all purposes.

BACKGROUND

The present disclosure relates to the manufacturing of semiconductor devices. More specifically, the disclosure relates to etching used in manufacturing semiconductor devices.

During semiconductor wafer processing, silicon containing layers are selectively etched.

SUMMARY

To achieve the foregoing and in accordance with the purpose of the present disclosure, a method for dry processing a substrate in a processing chamber is provided. The substrate is placed in the processing chamber. The substrate is dry processed, wherein the dry processing creates at least one gas byproduct. A concentration of the at least one gas byproduct is measured. The concentration of the at least one gas byproduct is used to determine processing rate of the substrate.

In another manifestation, a method for dry etching at least eight alternating layers over a substrate in a processing chamber is provided. The substrate is placed in the processing chamber. The at least eight alternating layers are dry etched, wherein the dry etching creates at least one gas byproduct. A concentration of the at least one gas byproduct is measured. The concentration of the at least one gas byproduct is used to determine etch rate of the substrate, etch selectivity, and etch uniformity. A chamber parameter is changed based on the measured concentration.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
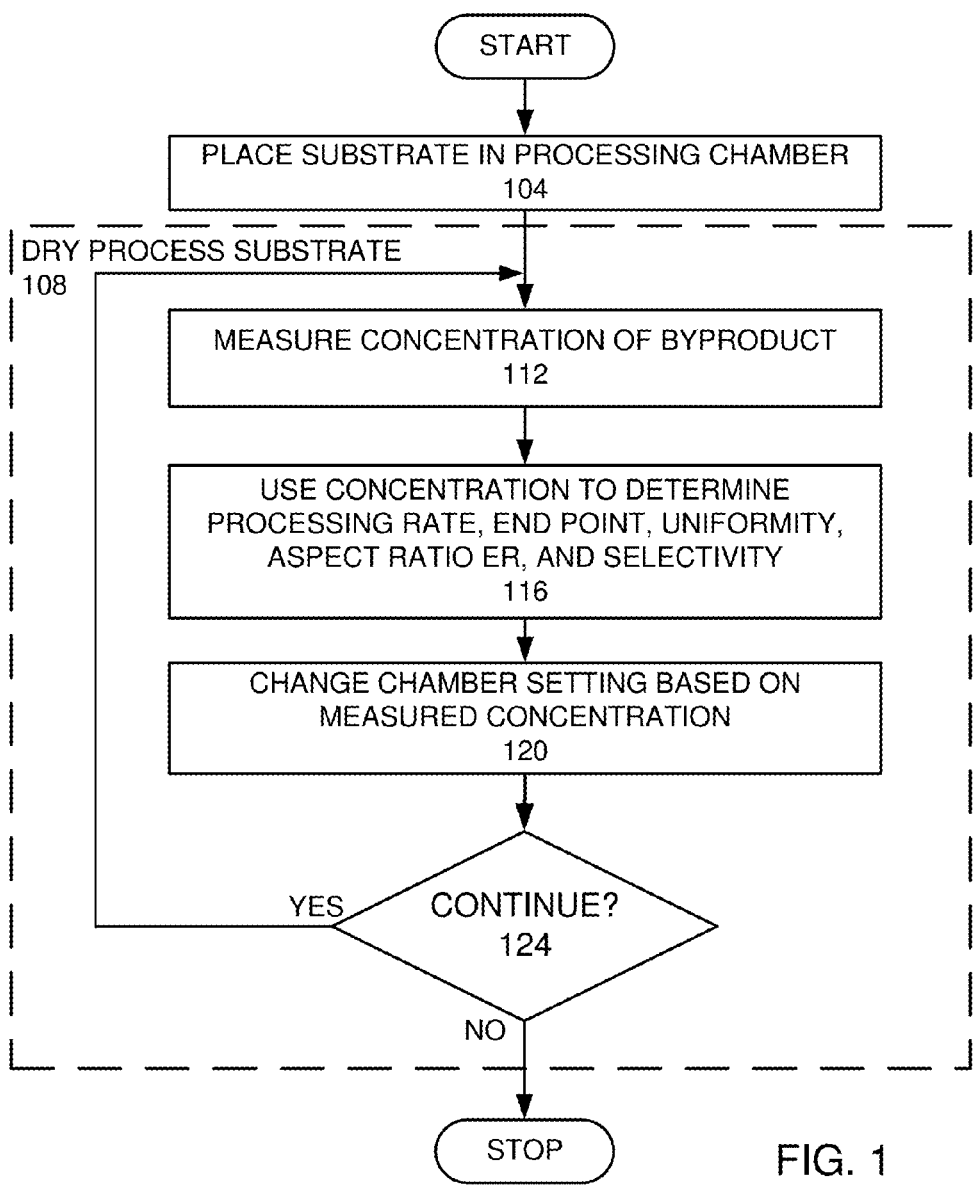
FIG. 1 is a high level flow chart of an embodiment.

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Current technology used for process control (e.g. endpoint) relies on relative measurements or indirect measurements of plasma parameters using emission spectroscopy, reflectance, or RF voltage and current. For endpoint control, optical emission spectroscopy reaches it limits with signal changes tending to zero when CDs shrink below 21 nm and aspect ratio increases beyond 30:1. For in-situ etch rate (ER) measurements using RF voltage/current are based on correlations that are not always maintained chamber to chamber.

An embodiment relies on absolute measurements of $SiF_4$ or $SiBr_4$, or $SiCl_4$ or other $SiX_4$ byproducts that is a direct byproduct of most silicon containing etches (nitrides, oxides, poly, and silicon films) when using fluorocarbon based chemistries. By combining the measurement with an etch model ($SiF_4$ mass balance based on XSEM images or a feature profile simulation model calibrated with XSEM images), one can predict endpoint, ER as a function of depth, average wafer selectivity, and uniformity in certain conditions. The $SiF_4$ byproducts are detected using IR absorption using quantum cascade laser spectroscopy allowing parts per billion level detection for accurate predictions.

This disclosure describes a method that combines etch-profile modeling coupled with $SiF_4$ IR-absorption to control the etch process. The method allows the extension of endpoint capability beyond the reach of tradition methods, such as emission spectroscopy, in high-aspect ratio applications such as DRAM cell-etch and 3D-NAND hole and trench patterning. The combination of absolute density measurement and etch profile emission modeling allows one to additionally determine in-situ etch process parameters such as ER, selectivity, and uniformity that can be used to achieve run-to-run process matching.

In an embodiment, an etch process is characterized by measuring a direct stable byproduct that can be used to determine: 1) Endpoint for high-aspect ratio DRAM and 3D-NAND etches for process/CD control, 2) Method to scale endpoint detection for future nodes, 3) Combined with a model one can determine in-situ: a) Average wafer ER and ER as function of depth (ARDE), b) An average wafer uniformity and selectivity, and c) Both measurements can be used for run-to-run matching and fault detection, 4) Using high sensitivity quantum cascade laser spectroscopy to achieve ppb level limit of detection needed for accurate etch endpoint and etch parameters estimation.

To facilitate understanding, FIG. 1 is a high level flow chart of a process used in an embodiment. A substrate is placed in a processing chamber (step 104). The substrate is dry processed (step 108). During the dry processing a gas byproduct is created. The concentration of the gas byproduct is measured (step 112). The measured concentration of the gas byproduct is used to determine processing rate, endpoint, uniformity, aspect ratio dependent etch rate, and selectivity (step 116). Chamber settings are changed based on the measured concentration of the gas byproduct (step 120). A determination is made on whether the dry process is complete (step 124). If the dry process is not complete the dry processing of the substrate 108 is continued by further measuring the concentration of the byproduct and continuing the cycle. If the dry process is complete, then the process is stopped.

Examples

Figure 2:
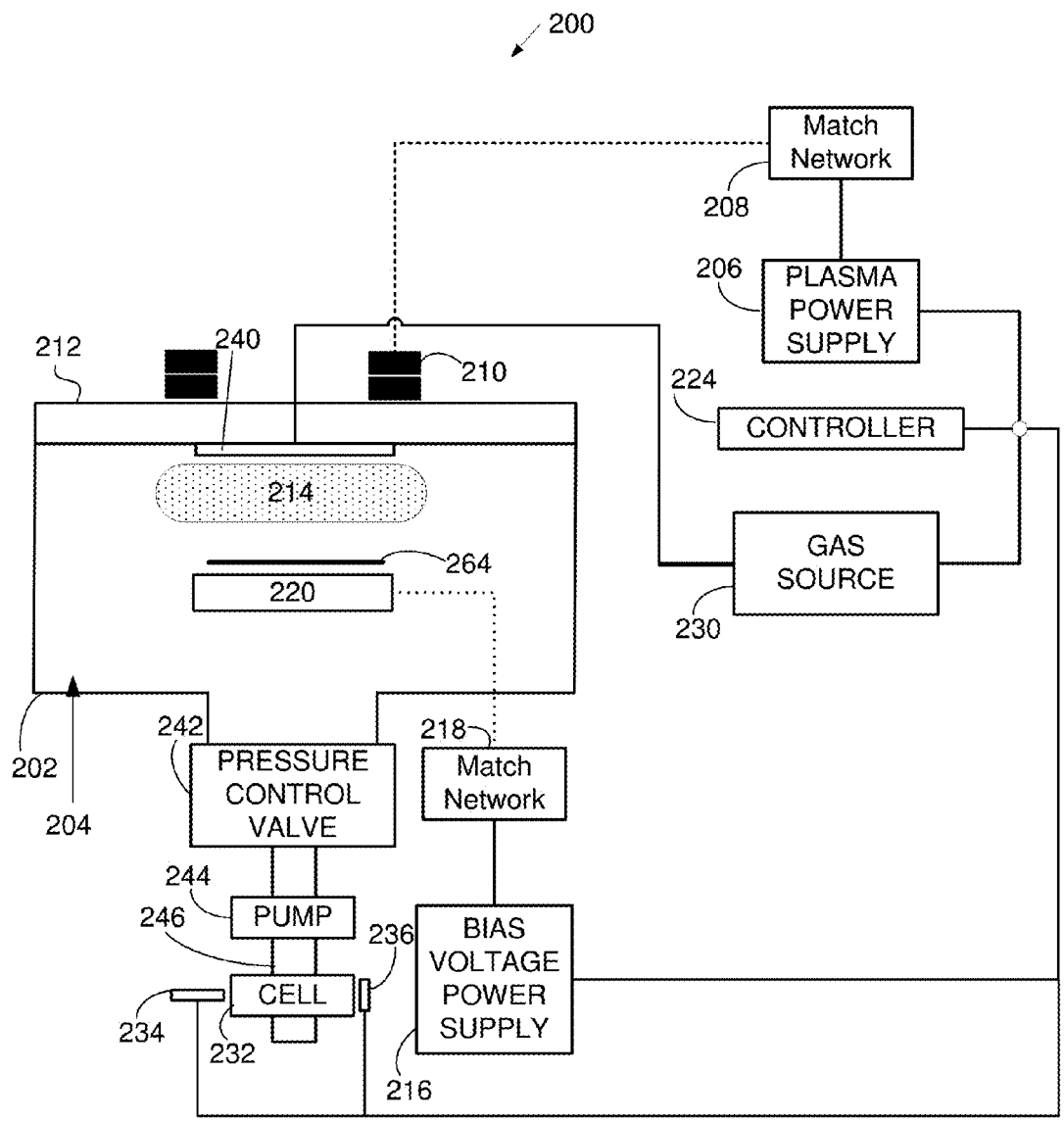
FIG. 2 is a schematic view of a plasma processing chamber that may be used in an embodiment.

In an example of a preferred embodiment, a substrate with a silicon containing layer is placed in a processing chamber (step 104). FIG. 2 schematically illustrates an example of a plasma processing chamber 200, which may be used to perform the process of etching a silicon containing layer in accordance with one embodiment. The plasma processing chamber 200 includes a plasma reactor 202 having a plasma processing confinement chamber 204 therein. A plasma power supply 206, tuned by a match network 208, supplies power to a TCP coil 210 located near a power window 212 to create a plasma 214 in the plasma processing confinement chamber 204 by providing an inductively coupled power. The TCP coil (upper power source) 210 may be configured to produce a uniform diffusion profile within the plasma processing confinement chamber 204. For example, the TCP coil 210 may be configured to generate a toroidal power distribution in the plasma 214. The power window 212 is provided to separate the TCP coil 210 from the plasma processing confinement chamber 204 while allowing energy to pass from the TCP coil 210 to the plasma processing confinement chamber 204. A wafer bias voltage power supply 216 tuned by a match network 218 provides power to an electrode 220 to set the bias voltage on the substrate 204 which is supported by the electrode 220. A controller 224 sets points for the plasma power supply 206, gas source/gas supply mechanism 230, and the wafer bias voltage power supply 216.

The plasma power supply 206 and the wafer bias voltage power supply 216 may be configured to operate at specific radio frequencies such as, for example, 13.56 MHz, 27 MHz, 2 MHz, 60 MHz, 200 kHz, 2.54 GHz, 400 kHz, and 1 MHz, or combinations thereof. Plasma power supply 206 and wafer bias voltage power supply 216 may be appropriately sized to supply a range of powers in order to achieve desired process performance. For example, in one embodiment, the plasma power supply 206 may supply the power in a range of 50 to 5000 Watts, and the wafer bias voltage power supply 216 may supply a bias voltage of in a range of 20 to 2000 V. For a bias up to 4 kV or 5 kV a power of no more than 25 kW is provided. In addition, the TCP coil 210 and/or the electrode 220 may be comprised of two or more sub-coils or sub-electrodes, which may be powered by a single power supply or powered by multiple power supplies.

As shown in FIG. 2, the plasma processing chamber 200 further includes a gas source/gas supply mechanism 230. The gas source 230 is in fluid connection with plasma processing confinement chamber 204 through a gas inlet, such as a shower head 240. The gas inlet may be located in any advantageous location in the plasma processing confinement chamber 204, and may take any form for injecting gas. Preferably, however, the gas inlet may be configured to produce a "tunable" gas injection profile, which allows independent adjustment of the respective flow of the gases to multiple zones in the plasma process confinement chamber 204. The process gases and byproducts are removed from the plasma process confinement chamber 204 via a pressure control valve 242 and a pump 244, which also serve to maintain a particular pressure within the plasma processing confinement chamber 204. The gas source/gas supply mechanism 230 is controlled by the controller 224. A Kiyo by Lam Research Corp. of Fremont, Calif., may be used to practice an embodiment. In other examples, a Flex by Lam Research Corp. of Fremont, Calif., may be used to practice an embodiment.

In this embodiment, connected to an exhaust pipe 246 after the pump 244, a gas cell 232 is provided, into which exhaust gas flows. An IR light source 234 is positioned adjacent to a window in the gas cell 232, so that an IR beam from the IR light source 234 is directed into the gas cell 232. The IR beam can travel through the gas cell multiple times (typically >1 m) to achieve ppb level or even lower hundredth of ppt detection limits. The IR light is absorbed by the gas as it travels inside the gas cell. An IR detector 236 is positioned adjacent to another window in the gas cell 232 to measure the light absorption level.

Figure 3:
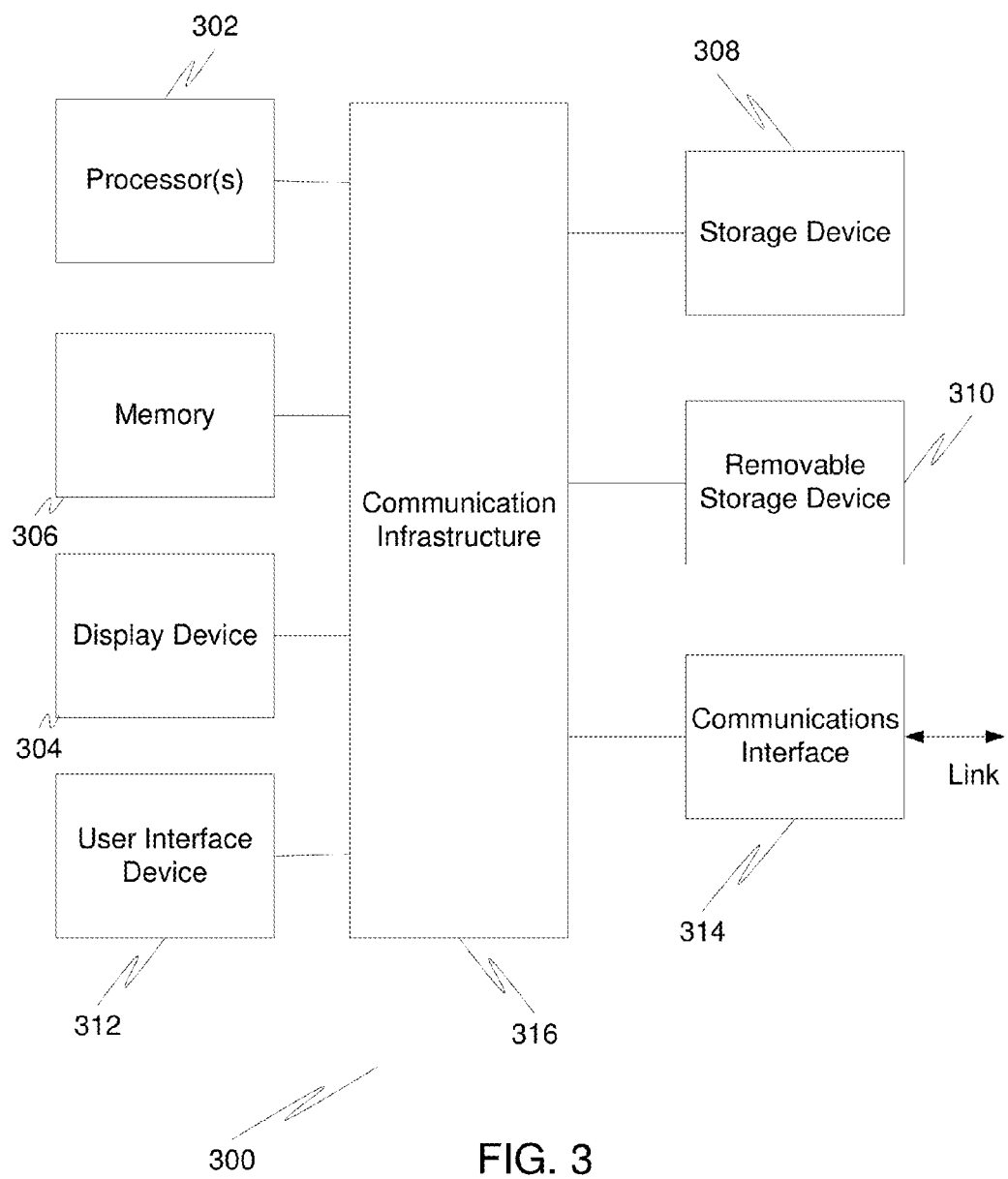
FIG. 3 is a computer system that may be used in an embodiment.

FIG. 3 is a high level block diagram showing a computer system 300, which is suitable for implementing a controller 224 used in embodiments. The computer system may have many physical forms ranging from an integrated circuit, a printed circuit board, and a small handheld device up to a huge super computer. The computer system 300 includes one or more processors 302, and further can include an electronic display device 304 (for displaying graphics, text, and other data), a main memory 306 (e.g., random access memory (RAM)), storage device 308 (e.g., hard disk drive), removable storage device 310 (e.g., optical disk drive), user interface devices 312 (e.g., keyboards, touch screens, keypads, mice or other pointing devices, etc.), and a communication interface 314 (e.g., wireless network interface). The communication interface 314 allows software and data to be transferred between the computer system 300 and external devices via a link. The system may also include a communications infrastructure 316 (e.g., a communications bus, cross-over bar, or network) to which the aforementioned devices/modules are connected.

Information transferred via communications interface 314 may be in the form of signals such as electronic, electromagnetic, optical, or other signals capable of being received by communications interface 314, via a communication link that carries signals and may be implemented using wire or cable, fiber optics, a phone line, a cellular phone link, a radio frequency link, and/or other communication channels. With such a communications interface, it is contemplated that the one or more processors 302 might receive information from a network, or might output information to the network in the course of performing the above-described method steps. Furthermore, method embodiments may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

A dry process is performed on the substrate in the processing chamber, where the dry process creates at least one gas byproduct (step 108). In different embodiments, either the substrate is a silicon wafer, which is etched, or one or more silicon containing layers over the substrate are etched.

In this example, a stack of alternating silicon oxide and silicon nitride layers is etched. Such an alternating stack of silicon oxide and silicon nitride is designated as ONON, which is used in 3D memory devices. In this example, there are at least eight alternating layers of ONON. In etching such a stack, both ER and selectivity decrease with aspect ratio, meaning that the difference between etch rates of the silicon oxide and silicon nitride decreases as aspect ratio, the ratio of the etch depth over the etch width, increases. To etch such a stack an etch gas of $C_xF_yH_z/O_2$ is provided by the gas source 230. RF power is provided by the plasma power supply 206 to the TCP coil 210 to form the etch gas into an etch plasma, which etches the stack and forms at least one gas byproduct, which in this example is $SiF_4$. (Other etch byproducts such as $SiBr_4$ or $SiCl_4$ can be monitored depending on the gas chemistry by tuning the IR light source to the absorption band of each byproduct.)

During the dry process, the concentration of the at least one gas byproduct is measured (step 112). In this embodiment, exhaust from the pump 244 flows to the gas cell 232. The IR light source 234 provides a beam of IR light into the gas cell 232. In this embodiment, sides of gas cell are equipped with a set of highly reflective mirrors 232 to reflect the beam of IR light a plurality of times before the beam of IR light is directed to the IR detector 236, which measures the intensity of the beam of IR light. The optical path length of the IR beam can reach few meters to few hundreds of meters thus allowing for sub ppb detection limit. Data from the IR detector 236 is sent to the controller 224, which uses the data to determine the concentration of the $SiF_4$.

Figure 4:
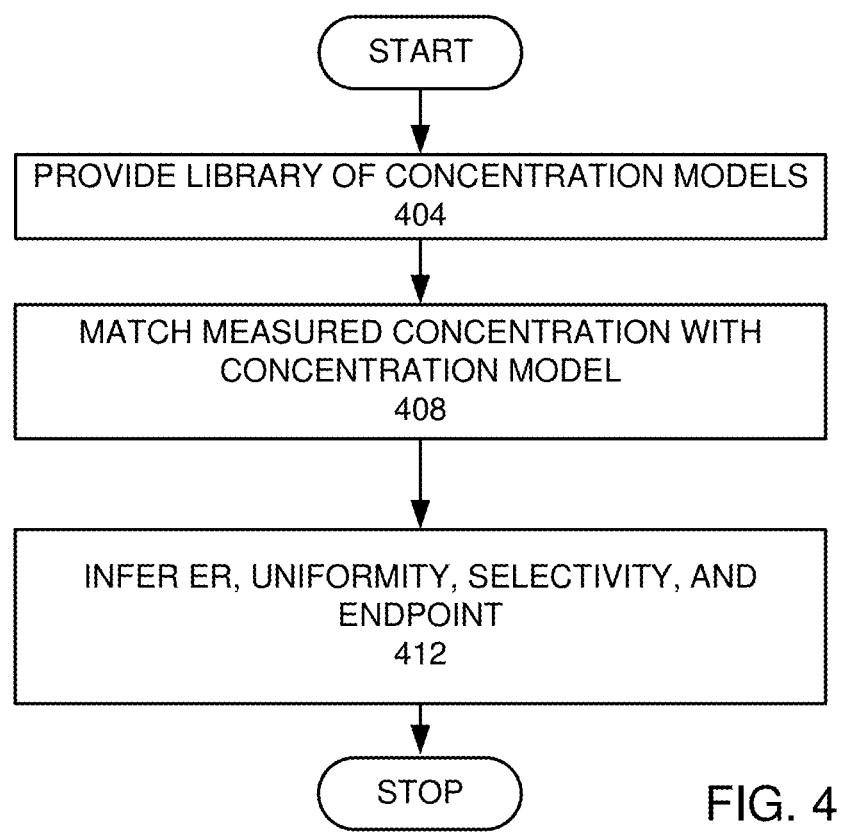
FIG. 4 is a more detailed flow chart of the surface reaction phase.

The measured concentration is used to determine processing rate, endpoint, uniformity, and selectivity (step 116). FIG. 4 is a more detailed flow chart of the step of using the measured concentration to determine processing rate. A library of concentration models is provided (step 404). Such models may provide feature/wafer scale etch as a function of aspect ratio, uniformity, and selectivity. Such models may be generated by experiment or may be analytically calculated, or may be determined using both methods. In an example of a creation of a model, an etch may be provided where concentration of a gas byproduct is measured over time. Since this example uses an etch, the processing rate is an etch rate. The etched features are examined and measured. From the measurements of the features and the measurement of the concentration of byproduct gas over time geometrical etch models and mass balanced equations may be used to determine etch rate, endpoint, uniformity, and selectivity. In one embodiment, a model would have a single concentration. In another embodiment, a model has a plurality of concentrations at various times. A plurality of measured concentrations over time is then used to match the closest model (step 408). The closest model is then used to determine an etch rate (step 412). The etch rate is the increase in the depth of etched features over time. To determine etch rate, endpoint, uniformity, and selectivity either a single measurement or a plurality of measurements may be used. The endpoint indicates when an etch is complete. This is may be determined by when a stop layer is reached or a discontinuity in the signal is reached. As mentioned above, the aspect ratio is the ratio of the etch depth over the etch width. The measured concentration may be used to determine the evolution of ER and selectivity with aspect ratio of the etched features since CD evolution of the feature is extracted from the model. Uniformity is a measurement of how evenly features are being etched. Features may be etched at different rates depending on feature width or feature density, causing nonuniform etch rates. The measured concentration may be used to determine the uniformity of the etch rates. Selectivity is a measurement of the difference in the etch rate of one material versus the etch rate of another material. In this example, the selectivity may be the difference in the etch rate of silicon oxide compared to silicon nitride for ONON or oxide to Poly for OPOP structures. In the alternative, selectivity may be the different in the etch rate of the silicon oxide compared to the etch rate of a mask material or a stop layer. The measured concentration may be used to determine etch selectivity.

Figures 5A, 5B:
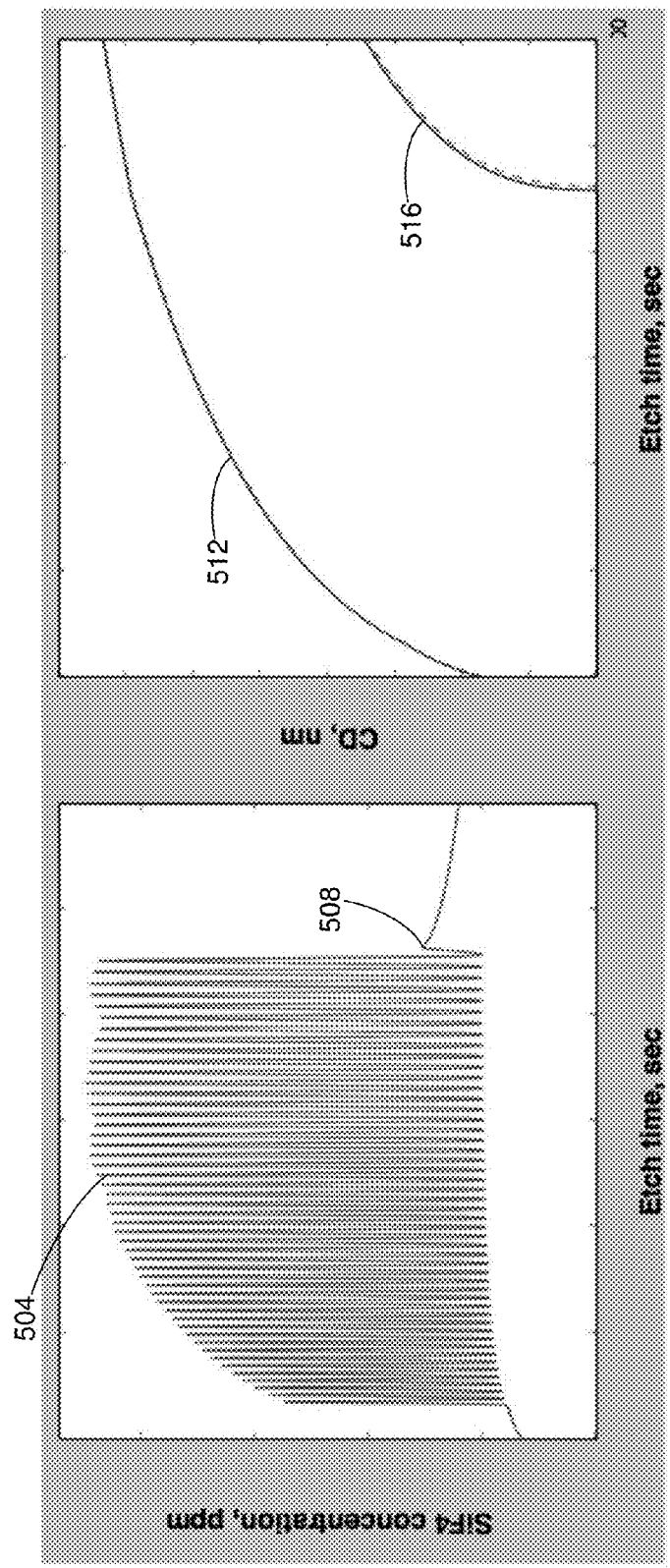
FIGS. 5A-F are graphs provided by an embodiment.
Figure 5D:
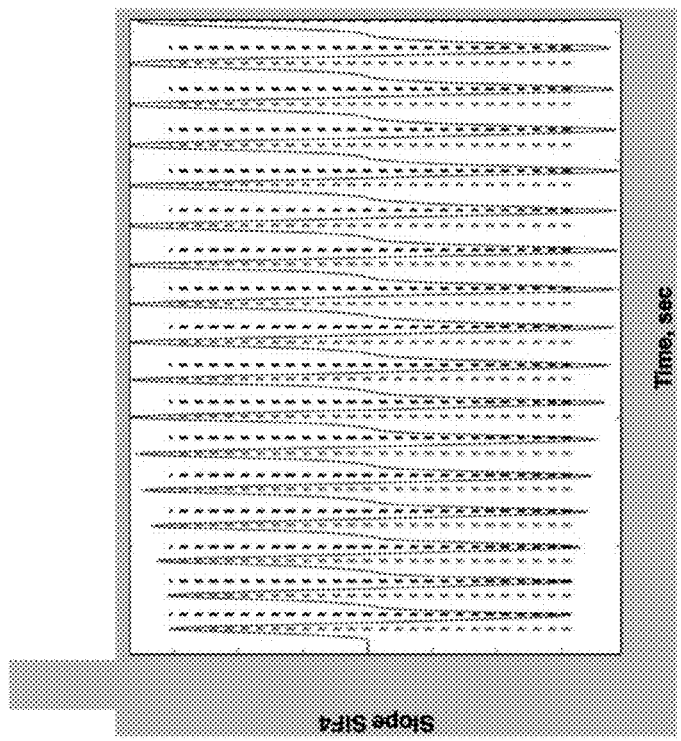
Figure 5C:
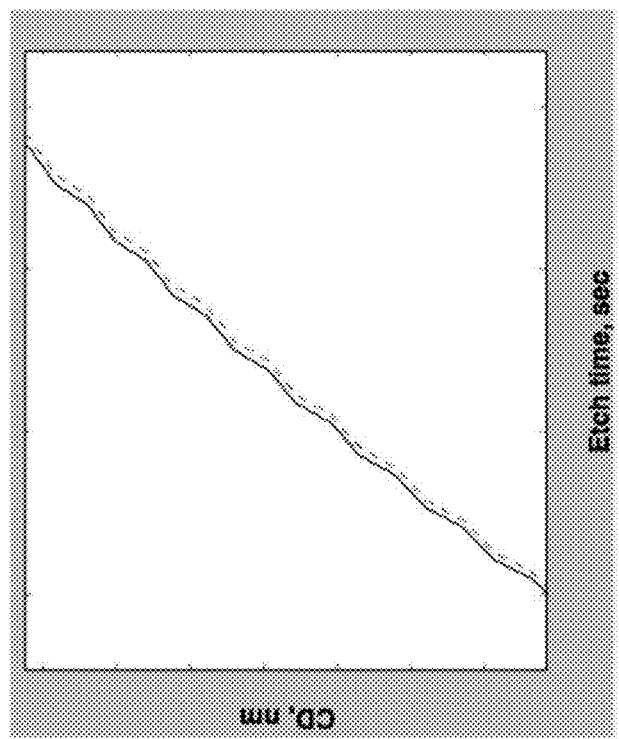
Figure 5F:
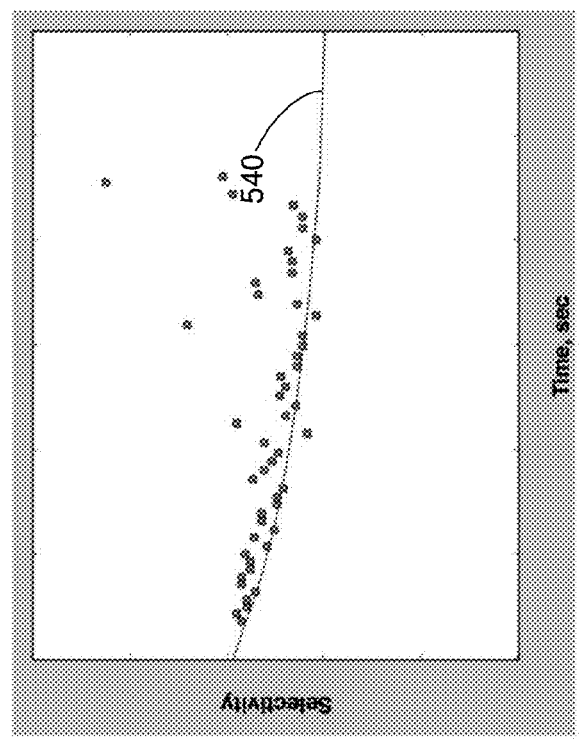
Figure 5E:
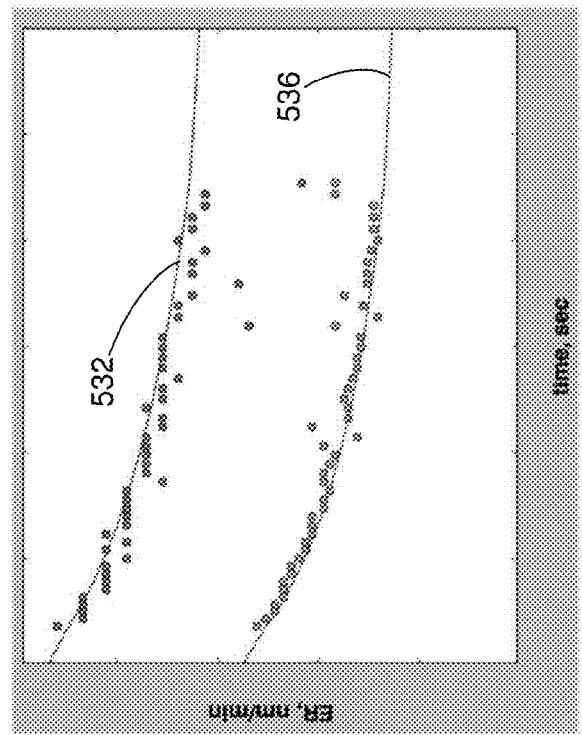

FIG. 5A is a graph 504 of the concentration of $SiF_4$ versus etch time when etching ONON stack. The alternating concentration is caused by etching the alternating nitride and oxide layers. The recipe in this embodiment etches SiN faster than SiO. As a result, the peak concentrations are when SiN is etched and the valleys are when SiO is etched. The times in between are transitions between SiN to SiO and vice versa. A touch down point 508 indicates the etch endpoint, when the last SiO or SiN layer has been etched. From the locations of the peaks and valleys, a selectivity of between 0.6:1 to 0.4:1 for the etch rate of SiO:SiN can be derived. FIG. 5B shows a graph of the top critical dimension tCD 512 and the bottom critical dimension bCD 516 of the features extracted from the model. In FIG. 5B the solid lines are values of CDs at the center of the wafer, the dashed lines represent the CDs at the edge of the wafer. From the top and bottom critical dimensions, the ARDE coefficient may be determined. In this example, the ARDE is determined to be 0.05. Uniformity is calculated to be 1%. FIG. 5C is a magnified graph of the tCD. FIG. 5D is a graph of the slope of the rate concentration $SiF_4$ versus time. The minimum and maximum concentrations over time may be obtained from this graph. FIG. 5E shows a graph of etch rate versus time for SiN 532 and for SiO 536, which is obtained from the peak and valley positions. Since depth increase with time, etch rate versus depth may be derived from the graphs. FIG. 5F is a graph 540 of the differences between the measured selectivity and a model.

Chamber settings are changed based on the measured concentration (step 120). When the endpoint is not found using the measured concentration (step 124), the etch process is continued and the process is continued back at step 112. If the etch stop is found, the etch may be stopped by stopping the flow of the etch gas and by stopping the power from the plasma power supply 206. If it is determined that the ER is too low, etch parameters such as gas or RF power may be changed to increase ER. If it is determined that the nonuniformity is too high, parameters such as gas feed to different region the chamber or ESC zones temperatures may be changed to improve uniformity.

Etch process parameters, such as ER, can be used for advanced fault detection to determine run-to-run and chamber-to-chamber performance by correlating them to on-wafer metrology parameters.

Figure 6:
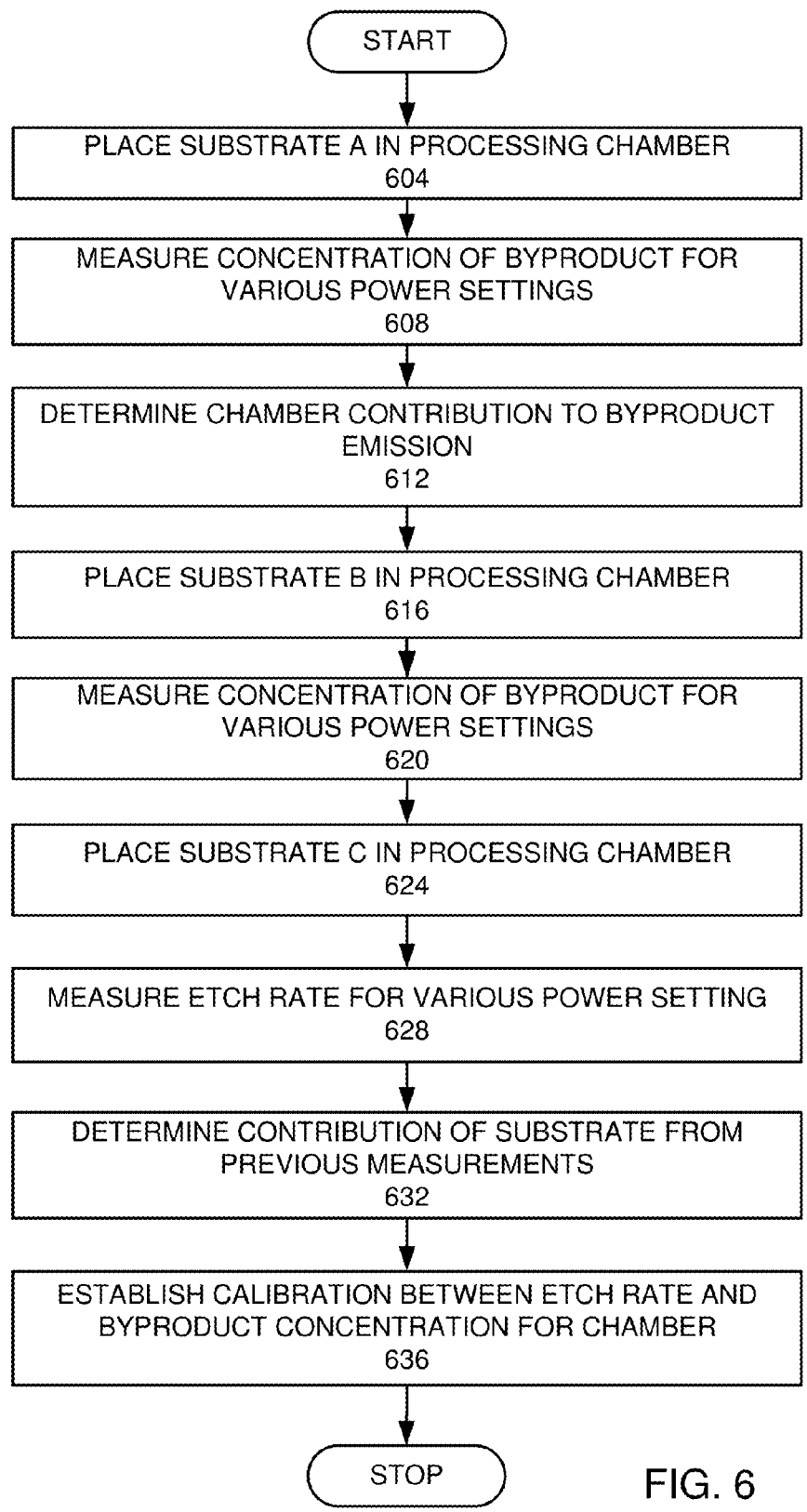
FIG. 6 is a high level flow chart of a method by which a substrate is used to measure the $SiF_4$.

To achieve a high degree of accuracy in measuring the concentration of the etch byproducts, e.g. $SiF_4$, one needs to determine the contribution to the byproducts under various conditions of the chamber from that of the wafer being etched. A calibration method based on the use of different type substrates is used to deconvolute each contribution. FIG. 6 is a high level flow chart of a method by which a substrate A made for instance of photo-resist is placed in the chamber (step 604), then process wear the concentration of $SiF_4$ is measured (step 604), which is then used to determine the $SiF_4$ emission contribution from the chamber (612). Then an oxide wafer (substrate B) is introduced into the processing chamber (step 616) to measure the emission of SiF$_4$ from both chamber and wafer for various power settings (step 620). By combining the concentration measurements and oxide ex-situ ER, one can calibrate the emission of SiF$_4$ with ER for each chamber. This calibration is required to achieve run-to-run and chamber-to-chamber process control and fault detection. Further calibration may be accomplished by removing the substrate B and placing another substrate (substrate C) in the processing chamber (step 624). The concentration of byproducts is measured for the process at various power settings (step 628). The contribution from the substrates and the chamber are determined based on the measurements (step 632). A calibration is established between the etch rate and byproduct concentration for the chamber (step 636).

Various embodiments may use generic geometric etch models based on measured profiles, such as XSEM profiles and/or simple mass balance equations to allow the use of the measured concentration of byproduct gas to determine processing rate, endpoint, uniformity, dependent ratio etch rate, or selectivity Advantages of placing the gas cell after the exhaust pump are that the gas is denser in after the exhaust pump than the gas in the processing chamber. In addition, reflective surfaces are not exposed to the plasma in the processing chamber, so that reflective surfaces would not be degraded by the plasma. In other embodiments, the gas cell is in the plasma processing chamber, such as surrounding the plasma region.

Various embodiments are useful for providing memory devices such as DRAM and 3D-NAND devices. In various embodiments the plasma process is an etch process of a silicon containing layer or a low-k dielectric layer. In various embodiments the RF power may be inductively coupled or capacitively coupled. A Flex by Lam Research Corp. of Fremont, Calif., may be used to practice an embodiment with capacitive coupling to etch DRAM and 3D NAND structures. In other embodiment, other types of plasma power coupling may be used. In other embodiments, alternating layers of silicon oxide and polysilicon (OPOP) may be etched.

While this disclosure has been described in terms of several preferred embodiments, there are alterations, permutations, modifications, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure.

What is claimed is:

1. A method for dry processing a substrate in a processing chamber, comprising:
creating a plurality of concentration models related to processing rate and processing uniformity;
placing the substrate in the processing chamber;
dry processing the substrate, wherein the dry processing creates at least one gas byproduct;
measuring a concentration of the at least one gas byproduct;
fitting the measured concentration of the at least one gas byproduct over time to at least one of the plurality of concentration models;
using the concentration of the at least one gas byproduct to determine processing rate of the substrate;
creating process parameters from the fitted at least one of the plurality of concentration models and the measured concentration of the at least one gas byproduct;
using the created process parameters to determine run-to-run and chamber-to-chamber performance; and
using the concentration of the at least one gas byproduct to determine processing uniformity.

2. The method, as recited in claim 1, further comprising using the concentration of the at least one gas byproduct to determine process endpoint.

3. The method, as recited in claim 2, wherein the process is plasma etching, and further comprising using the concentration of the at least one gas byproduct to determine aspect ratio dependent ER.

4. The method, as recited in claim 3, wherein the process is plasma etching alternating layers, and further comprising using the concentration of the at least one gas byproduct to determine aspect ratio dependent selectivity.

5. The method, as recited in claim 1, further comprising changing a chamber setting based on the measured concentration of the at least one gas byproduct.

6. The method, as recited in claim 1, wherein the dry processing the substrate comprises plasma etching the substrate or a stack over the substrate.

7. The method, as recited in claim 1, wherein the dry processing the substrate comprises etching a silicon containing layer.

8. The method, as recited in claim 1, wherein the byproducts comprise at least one of SiF$_4$, SiCl$_4$, SiBr$_4$, COF$_2$, CO$_2$, CO and CF$_4$.

9. The method, as recited in claim 1, wherein the using the concentration of the at least one gas byproduct to determine etch selectivity.

10. The method, as recited in claim 1, wherein the measuring a concentration of the at least one gas byproduct comprises using IR absorption with a multi-pass gas cell to measure the concentration of at least one gas byproduct.

11. The method, as recited in claim 10, wherein the IR absorption measures the concentration of at least one gas byproduct after the at least one gas byproduct is pumped through an exhaust pump.

12. The method, as recited in claim 1, wherein the byproducts comprises SiF$_4$.

13. A method for dry etching at least eight alternating layers over a substrate in a processing chamber, comprising:
creating a plurality of concentration models related to processing rate and processing uniformity;
placing the substrate in the processing chamber;
dry etching the at least eight alternating layers, wherein the dry etching creates at least one gas byproduct;
measuring a concentration of the at least one gas byproduct;
fitting the measured concentration of the at least one gas byproduct over time to at least one of the plurality of concentration models;
using the concentration of the at least one gas byproduct to determine etching rate of the substrate, etch selectivity, and etch uniformity;
creating process parameters from the fitted at least one of the plurality of concentration models and the measured concentration of the at least one gas byproduct;
using the created process parameters to determine run-to-run and chamber-to-chamber performance; and
changing a chamber parameter based on the measured concentration.

* * * * *